United States Patent [19]

Yamaguchi et al.

[11] Patent Number: 4,684,889
[45] Date of Patent: Aug. 4, 1987

[54] NMR APPARATUS COMPENSATED FOR PRIMARY FIELD CHANGES

[75] Inventors: Keiki Yamaguchi; Kazuya Hoshino; Hideto Iwaoka, all of Tokyo, Japan

[73] Assignees: Yokogawa Hokushin Electric Corporation; Yokogawa Medical Systems, Limited, both of Tokyo, Japan

[21] Appl. No.: 719,750

[22] Filed: Apr. 4, 1985

[30] Foreign Application Priority Data

Apr. 20, 1984 [JP] Japan .................................. 59-79659

[51] Int. Cl.⁴ .............................................. G01N 24/08
[52] U.S. Cl. .................................... 324/308; 324/309
[58] Field of Search ................ 324/308, 309, 313, 320

[56] References Cited

U.S. PATENT DOCUMENTS

| | | | |
|---|---|---|---|
| 3,034,040 | 5/1962 | Williams | 324/308 |
| 4,284,950 | 8/1981 | Burl et al. | 324/313 X |
| 4,528,510 | 7/1985 | Loeffler et al. | 324/308 X |
| 4,585,992 | 4/1986 | Maudsley et al. | 324/320 X |

FOREIGN PATENT DOCUMENTS

| | | | |
|---|---|---|---|
| 0066346 | 4/1982 | Japan | 324/308 |
| 0055741 | 4/1983 | Japan | 324/309 |
| 0148854 | 8/1984 | Japan | 324/320 |
| 0190643 | 10/1984 | Japan | 324/320 |
| 2121545 | 12/1983 | United Kingdom | 324/309 |
| 2128748 | 5/1984 | United Kingdom | 324/309 |

OTHER PUBLICATIONS

Lai, C. et al., "Automatic Correction of NMR Zeugmotographic Projections," *Jrnl. Phys. E. Sci. Instruments*, vol. 14, 1981.

Yamamoto et al., "Inspecting Device Using Nuclear Magnetic Resonance", PTO Translation #3371 of Japanese Kokai Pat. No. Sho 58-55741.

*Primary Examiner*—Michael J. Tokar
*Assistant Examiner*—Francis J. Jaworski
*Attorney, Agent, or Firm*—Moonray Kojima

[57] ABSTRACT

An object which can provide a reference for measuring the intensity of a primary magnetic field, is positioned in the vicinity of a subject being examined. A variation in the primary magnetic field intensity is detected, based on a frequency shift of data observed of the object, and is used to control the primary magnetic field intensity, or reference frequency for phase detection, or to correct image data. In this manner image quality is prevented from being degraded due to the variation of the primary magnetic field intensity.

2 Claims, 7 Drawing Figures

NMR APPARATUS COMPENSATED FOR PRIMARY FIELD CHANGES

BACKGROUND OF THE INVENTION

1. Field of Invention

This invention relates to a diagnostic apparatus employing nuclear magnetic resonance (NMR), and more particularly, to means for preventing the image quality from being degraded due to time dependent variations of the primary magnetic field intensity in an NMR computerized tomographic apparatus.

2. Description of the Prior Art

Conventional NMR diagnostic apparatus, such as NMR computerized tomographic apparatus, generate a primary magnetic field by energizing a primary magnetic field coil with a constant current. However, the power supply for the primary magnetic field coil may vary in its output, or the primary magnetic field coil may vary in its shape due to variations in the room temperature or the temperature of the primary magnetic field coil per se, with the result that the intensity of the primary magnetic field may vary over a few tens ppm. When the primary magnetic field varies in intensity, the image of a diagnosed area is liable to suffer from an artifact.

SUMMARY OF THE INVENTION

Accordingly, an object of the invention is to provide an NMR diagnostic apparatus having means for preventing artifacts from being generated due to variations in the primary magnetic field.

According to the invention, an NMR diagnostic apparatus measures the intensity of a magnetic field by placing an object of known properties, such as water, in the vicinity of a subject being examined, and controls the field intensity, corrects a computed value, or controls the reference frequency of a phase detector, based on the measured field intensity used as a reference.

DETAILED DESCRIPTION OF PREFERRED EMBODIMENTS

Figure 1:
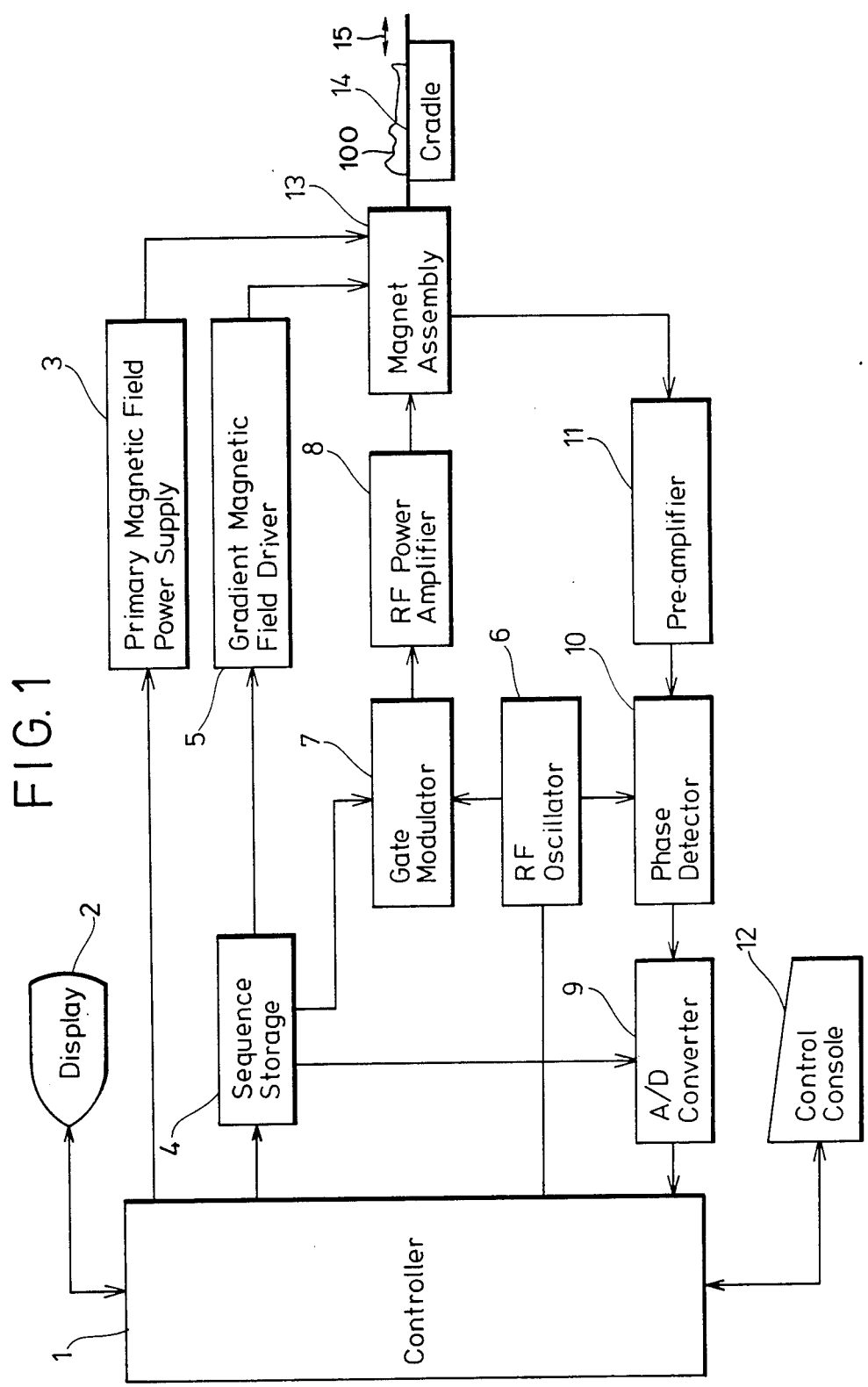
FIG. 1 is a block diagram depicting an illustrative embodiment of the invention comprising an NMR diagnostic apparatus.

Turning now to FIG. 1 there is depicted an illustrative embodiment which is incorporated in an NMR tomographic apparatus and which comprises a controller 1, which comprises a computer, connected to a display unit 2, a primary magnetic field power supply 3, a sequence storage unit 4, an RF oscillator 6, an analog-to-digital (A/D) converter 9, and a control console 12. Primary magnetic field power supply 3 is coupled to a magnetic assembly 13. Sequence storage unit 4 is connected to a gradient magnetic field driver 5, a gate modulator 7, and A/D converter 9. Gradient magnetic field driver 5 is connected to magnetic assembly 13. Gate modulator 7 is connected to an RF power amplifier 8 which is coupled to magnetic assembly 13. RF oscillator 6 is joined to gate modulator 7 and a phase detector 10 connected to A/D converter 9. Magnetic assembly 13 is coupled to a preamplifier 11 which is connected to phase detector 10.

Magnetic assembly 13 comprises a primary field coil, x-axis, y-axis and z-axis gradient field coils, an RF transmission coil, an NMR signal receiving coil and a space therein for placement of a subject to be examined. Assembly 13 applies a primary magnetic field, gradient magnetic fields, and RF pulses to a subject 100 (see FIG. 2) placed in the space therein, and receives an NMR signal representing a resonance frequency and a resonance energy level.

A cradle 14, with subject 100 supported thereon, and which is movable into and out of the space in assembly 13, as shown by the double arrow 15, is placed into the space in the assembly 13. A pipe (such as shown representationally as a rectangular outer shell 20), filled with water is attached to the underside of cradle 14. The object which is used to measure the magnetic field intensity, and which may be water filled in the pipe, will be described in detail hereinbelow.

Primary magnetic field power supply 3 is coupled to the primary field coil in assembly 13, for applying the primary field to subject 100. Supply 3 is controlled by controller 1 to control the intensity of the primary magnetic field, as described hereinbelow in greater detail.

Sequence storage unit 4 generates a timing signal for collecting observed data of an NMR energy level, and for controlling operation of gradient magnetic field driver 5, gate modulator 7, and A/D converter 9. Sequence storage unit 4 thus controls the sequence in which the gradient magnetic fields and the RF magnetic field are generated.

Gradient magnetic field driver 5 is connected to x-axis, y-axis and z-axis gradient coils in magnetic assembly 13 for applying the respective gradient magnetic fields to subject 100.

RF oscillator 6, gate modulator 7, and RF amplifier 8 are arranged to apply RF pulses to subject 100, placed in magnetic assembly 13, to give nuclear magnetic resonance to the nuclei of atoms in subject 100. RF oscillator 6 produces an RF signal. Gate modulator 7 is responsive to the timing signal from sequence storage unit 5 for modulating the Rf signal from RF oscillator 6 to thereby generate RF pulses. RF power amplifier 8 amplifies the RF pulses from gate modulator 7 and supplies the amplified Rf pulses to the RF transmission coil in magnet assembly 13.

A/D converter 9, phase detector 10, and preamplifier 11 operate to observe an NMR signal to collect observed data in digital form. Preamplifier 11 is joined to the NMR signal receiving coil in assembly 13 for amplifying the NMR signal. Phase detector 10 detects the phase of the output from preamplifier 11 with respect to the output signal from RF oscillator 6. A/D converter 9 serves to convert the phase detected NMR signal into a digital signal.

Controller 1 rewrites the stored content of sequence storage unit 4 and controls primary magnetic field power supply 3 and RF oscillator 6. Various control sequences can be obtained by rewriting the stored content of sequence storage unit 4. Controller 1 also effects an arithmetic operation on the observed data to construct an image from a distribution of resonance energy levels.

Display unit 2 displays the image of the NMR atom distribution as computed by controller 1. Control console 12 is operated by an operator to enter input signals provided by the operator. According to a feature of the invention, an object for measuring the magnetic field intensity is placed in the vicinity of the subject 100. The object may be of any given shape, and have known properties. In the illustrative embodiment, water disposed in a suitable container, such as a pipe, was used.

The object should be positioned to meet the following conditions:
1. It should not interfere with subject 100.
2. It should provide at least one view in which a projection of subject 100 and a projection of the field intensity measuring object are not overlapped.
3. It should be disposed as closely to the NMR signal receiving coil as possible.
4. It should be disposed in a uniform magnetic field.

Condition (1) is a requirement which should naturally be met by a diagnostic apparatus. Condition (2) is required for measuring the intensity of the primary magnetic field. The primary magnetic field intensity cannot be measured if a projecting of subject 100 and a projection of the field intensity measuring object are overlapped in all views. Conditions (2) and (3) are required for providing a good signal-to-noise ratio.

In the actual diagnostic apparatus, it is desired to search for a position which meets the above conditions outside of the region for obtaining an image of the subject 100, or to position the field intensity measuring object or substance on each of both sides of cradle 14 or beneath cradle 14. If the field intensity measuring object is to be attached to cradle 14, movement of cradle 14 should be taken into account. That is, the field intensity measuring substance should be attached to cradle 14 over its entire length to produce a constant NMR signal without being affected by the movement of cradle 14. It is also necessary to have accurate information about the height and width of cradle 14.

Figure 2:
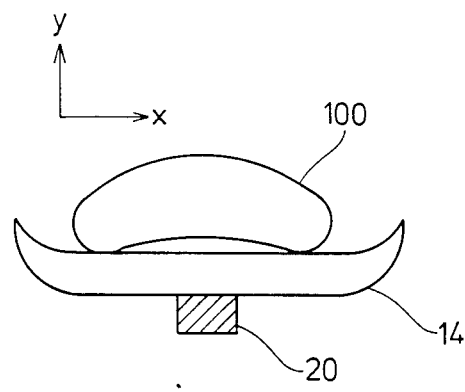
FIG. 2 is a cross sectional view of a cradle.

FIG. 2 is illustrative of the cross section of cradle 14. Water 20, filling a pipe, is disposed beneath cradle 14 and serves as the object used to measure field intensity. The pipe (or water filled in a container) extends over the entire length of the cradle 14.

Figure 3:
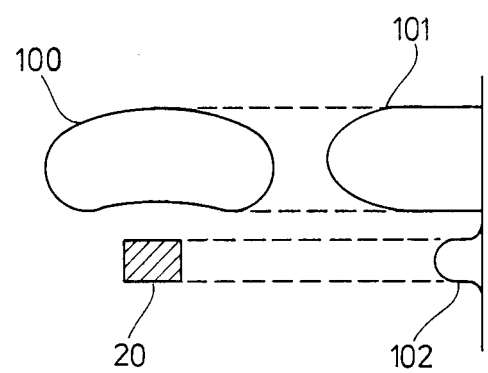
FIG. 3 is a diagram showing projecting images of a subject being examined and water filled in a pipe.

FIG. 3 shows a projection of subject 100 and a projection of water 20, such as filled in a pipe. As illustrated in FIG. 3, water 20,.filling a pipe, is positioned to provide at least one view in which a projection of subject 100 and a projection of the field intensity measuring substance or object 20 are not overlapped during one scanning cycle.

In the illustrated embodiment, the field intensity measuring substance is of a rectangular cross section. However, the object may be of any desired or given shape. However, where the diagnostic apparatus is used according to the spin warp method, the signal intensity of a view is abruptly reduced as the amount of warp is increased if the object is thick in the direction of warp (in the direction in which spin is warped by magnetic resonance, or in the y-direction, in FIG. 2). Thus, there are fewer views having a signal-to-noise ratio which can be used in the measurement of the primary magnetic field intensity. If the substance is thin in the direction of warp, then the entire signal for measuring the primary magnetic field intensity is reduced, resulting in a reduction of the measuring accuracy. Thus, the optimum thickness of the field intensity measuring object should be determined in view of the above considerations.

While in the above embodiment water 20, contained in a pipe, is employed as the field intensity measuring object, any material may be employed provided it is of a prescribed or given shape and of known properties. One or more field intensity measuring objects or substances may be used together with each other.

Figure 4:
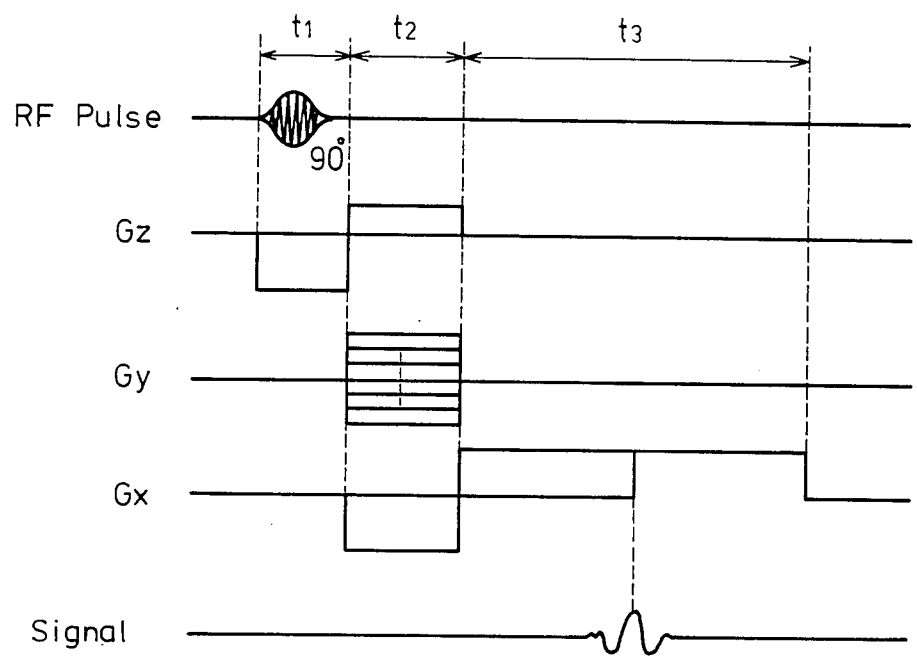
FIG. 4 is a timing chart depicting a scanning pulse sequence used in a spin warp saturation recovery method.

FIG. 4 is a timing chart depicting a pulse sequence for one view scanned by the general spin warp saturation recovery method. In a time period $t_1$, one sectional plane of the subject is specified by gradient magnetic field Gz in the z direction, and spins in the subject are selectively excited and rotated 90° by an RF pulse. In a time period $t_2$, the phase of the spins is encoded according to a y coordinate by the gradient magnetic field Gy in the y direction. In a time period $t_3$, the total of echo signals from spin frequency encoded in the x direction by the gradient magnetic field in the x direction is received. In a succeeding view, the intensity of the magnetic field Gy in the y direction in time period $t_2$ is varied to move the y coordinate to be observed.

The amount of phase encoding (corresponding to the intensity of the gradient magnetic field in the y axis direction) from one end to the other of a region to be constructed as an image in the y axis direction is called the amount of warp. By varying the amount of warp for $2n\pi$ (n is an integer) in each view, a component parallel to the x-axis of a two dimensional Fourier transformed quantity of a density distribution of NMR atoms in the subject can be obtained directly as observed data on the time base. For data observed by a view in which the amount of warp is "0", the time base data is subjected to a reverse Fourier transform to obtain projections of subject 100 and the field intensity object onto the x axis.

Figure 5:
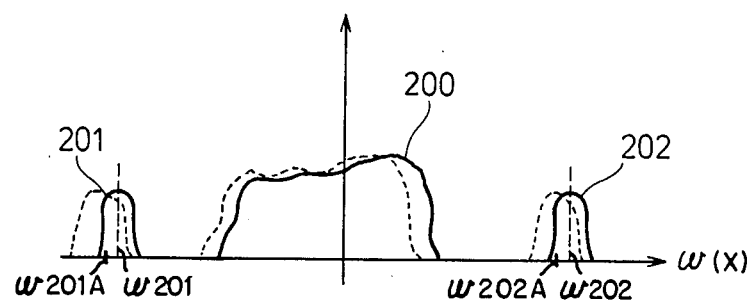
FIG. 5 is a spectral plot showing varying of field strength due to drift of temperature or field core voltage.

FIG. 5 shows the projections of a subject and field intensity objects onto the x axis. In this example, the field intensity measuring objects are disposed on both sides of the subject, and hence projections 201, 202 of the field intensity measuring objects are displayed on both sides of the projection 200 of subject 100.

From the positions of the field intensity measuring objects and the intensity of the gradient magnetic field Gx in the x direction, there are obtained a central frequency $\omega_{201A}$ of projection 201 and a central frequency $\omega_{202A}$ of projection 202 in case the intensity of the primary magnetic field remains unchanged. These frequencies $\omega_{201A}$, $\omega_{202A}$ and actually measured frequencies $\omega_{201}$, $\omega_{202}$ are compared to determine a variation of the intensity of the primary magnetic field.

More specifically, $$\Delta\omega_{201} = \omega_{201} - \omega_{201A} \quad (1)$$

$$\Delta\omega_{202} = \omega_{202} - \omega_{202A} \quad (2)$$

A transition $\Delta\omega$ of a certain frequency due to the variation of the primary magnetic field intensity is given by:

$$\Delta\omega = \tfrac{1}{2}(\Delta\omega_{201} + \Delta\omega_{202}) \quad (3)$$

Assuming the gyromagnetic ratio is expressed by $\gamma$, the transition $\Delta\omega$ of the certain frequency and the variation ΔB of the primary magnetic field intensity have the following relationship:

$$\Delta\omega = \gamma\Delta B \quad (4)$$

Thus, the variation of the primary magnetic field intensity can also be determined theoretically by the above procedure.

It is preferable to effect the foregoing measurement in each view in order to detect a variation of the primary magnetic field intensity during scanning. However, in reality, the received signal is reduced in a view with a large amount of warp, and it is impossible to make the measurements in each view. Thus, views with small amounts of warp are scattered during scanning and used as magnetic field intensity measuring views, and several primary magnetic field intensities are measured in one scanning cycle. For the other views, interpolated values are used. Since the primary magnetic field does not vary abruptly, the intensity thereof only needs to be measured several times. The magnetic field intensity measuring views may be spaced at equal or irregular intervals.

Based on the measured intensity of the primary magnetic field, the controller 1 controls the primary magnetic field power supply 3 or corrects the obtained data.

Correction of the obtained data will now be described. Although a basic correcting method will be described hereinbelow, there are other correcting methods available for various scanning methods.

Since variation of the primary magnetic field intensity is ordinarily slow, the Fourier transform method has only small effect on the phase encoding in many cases. Thus, variation of the primary magnetic field intensity appears principally as a frequency shift of the observed data. Providing the frequency difference between the Larmor frequency $\omega_1$ given by the primary magnetic field intensity and the reference frequency $\omega_0$ is given by $\Delta\omega$, observed data $f(t)$ when $\Delta\omega=0$ and observed data $f'(t)$ when $\Delta\omega\neq 0$ have the following relationship:

$$f'(t) = f(t) \exp(-j\Delta\omega t) \quad (5)$$

Therefore, reference frequency $\omega_0$ may be varied or the observed data may be corrected according to the equation (5).

Figure 6:
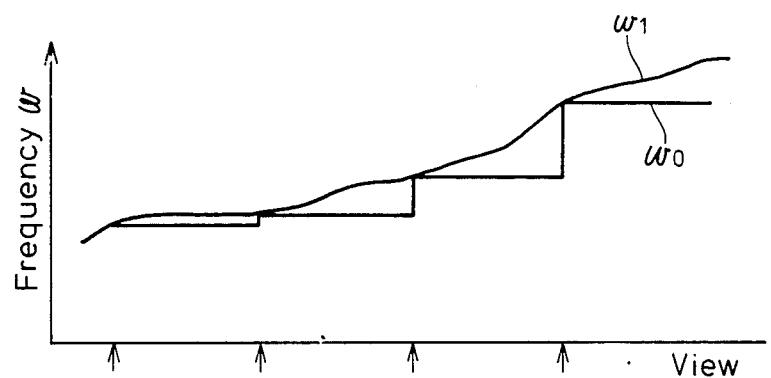
FIG. 6 is a diagram depicting variations of a reference fréquency $\omega_0$.

FIG. 6 shows the manner in which reference frequency $\omega_0$ is varied. As the primary magnetic field intensity varies, Larmor frequency $\omega_1$ varies, and reference frequency $\omega_0$ is brought into conformity with the Larmor frequency $\omega_1$ during respective magnetic field intensity measuring viewings or views as indicated by the arrows in FIG. 6. This prevents the phase detected signal from being affected by the variation of the primary magnetic field intensity.

For varying reference frequency $\omega_0$, the oscillation frequency of RF oscillator 6 is controlled so as to coincide with Larmor frequency $\omega_1$ obtained during the magnetic field intensity measuring view, thus changing the reference frequency of phase detector 10.

The above correcting method is capable of correcting reference frequency $\omega_0$ during the timing of the magnetic field intensity measuring views, so that reference frequency $\omega_0$ varies in a step like manner, as depicted in FIG. 6. Consequently, it is preferable to use many magnetic field intensity views.

Figure 7:
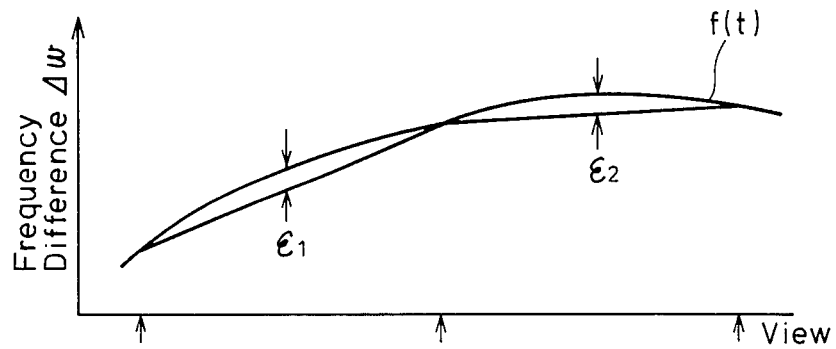
FIG. 7 is a diagram depicting the manner in which observed data are corrected.

FIG. 7 shows the manner in which the observed data is corrected. The observed data $f'(t)$ is corrected in the following manner, using the frequency difference $\Delta\omega$ between Larmor frequency $\omega_1$ and reference frequency $\omega_0$:

$$f(t) = f'(t) \exp(j\Delta\omega t) \quad (6)$$

Equation (6) indicates that $f'(t)$ is frequency shifted by $-\Delta\omega$. For a variation in the magnetic field intensity from a measurement of the primary magnetic field intensity to a next measurement thereof, $\Delta\omega$ is required to be estimated by appropriate interpolation. FIG. 7 shows an example of linear interpolation, in which magnetic field measuring views should be applied at such intervals that an estimated error $\epsilon_i(i=1, 2, \ldots)$ in each interval will be kept within a certain range. The correction of data in interval 1 is possible after the second magnetic field measuring view, that is, at a time when intervals 2 is being scanned. Thus, the scanning and data correction can be effected at the same time.

The primary magnetic field applied to the subject, based on a specific frequency, can be controled to apply relatively slow variations within a broad frequency range, and the reference frequency of the phase detection can be controlled to apply fast variations within a narrow frequency range.

The observed data can be corrected independently. As the deviation of the magnetic field becomes larger, however, a sliced plane is distorted. Thus, data correction is preferably combined with the method in which the reference frequency $\omega_0$ is varied.

While the scanning according to the Fourier transform method has been described, the present invention is also applicable to a projection method. The NMR computerized tomographic apparatus has no moving parts, unlike the X-ray computerized tomographic apparatus. Thus, the observing sequence can be selected as desired providing there is a one-to-one correspondence between the view number, and the view angle. Accordingly, views in which a projection of the magnetic intensity measuring object and a projection of the object are not overlapped are scattered in one scanning cycle, and the primary magnetic field intensity is measured only in such views, while values obtained by interpolating the measured values are employed for the other views. The views in which the primary magnetic field intensity is measured may be spaced at equal or irregular intervals. The reference value for the central frequency of the projection of the magnetic field intensity measuring object varies dependent on different view angles, and such a variation can be easily determined by the view angle.

The present invention is applicable irrespectively of pulse sequence such as the saturation recovery method, the reverse recovery method, the FID method, the spin echo method, and the like.

As described, the NMR diagnostic apparatus of the invention is capable of measuring time dependent variations of the primary magnetic field intensity, and hence of preventing artifacts from being generated due to variations in the primary magnetic field intensity. The measurement of the primary magnetic field intensity is not affected by movements of the subject. The invention is, therefore, advantageous when applied to medical diagnostic apparatus.

The cradle 14 is depicted in the drawing to be outside assembly 13. The assembly 13 has a space therein for placement of the cradle 14 and subject 100 therein during examination, and at other times, the cradle 14 and subject 100 are disposed outside of the assembly 13.

The foregoing description is illustrative of the principles of the invention. Numerous modifications and extensions thereof would be apparent to the worker skilled in the art. All such modifications and extensions are to be considered to be within the spirit and scope of the invention.

What is claimed is:

1. An NMR diagnostic imaging apparatus comprising means for positioning a field intensity measuring object of a given shape and having known properties in the vicinity of a subject to be examined such that said field intensity measuring object and said subject are not overlapped at least in one direction of projection;

means for applying a primary magnetic field to said subject and to said object;

means for applying RF pulses that give nuclear magnetic resonance to the nuclei of atoms constituting the tissue of said subject and of atoms of said object;

means for applying gradient magnetic fields to project an NMR signal of said nuclei of atoms at least in one direction and an NMR signal of said object;

means for phase-detecting and monitoring the NMR signals projected by said gradient magnetic field applying means and representing the subject and the object; and arithmetic means for constructing an image of the tissue of the subject from an output signal from said monitoring means;

wherein said means for phase-detecting and monitoring said NMR signals comprises means for detecting the phase of the NMR signals at different time intervals and comparing the phase with the RF pulses, means for monitoring the Larmour frequency of the nuclei of atoms in said object, and means for selectively controlling the oscillation frequency of the RF pulses to conform to the Larmour frequency when the phase is detected whereby the variations in the primary magnetic field have no effect on the constructed image.

2. The apparatus of claim 1, wherein said means for applying a primary magnetic field comprises means for controlling the intensity of said primary magnetic field applied to said subject so that there is relatively slow variation of the primary magnetic field within a broad frequency range, and means for controlling the RF oscillation frequency to be at a relatively fast variation within a narrow frequency range.

* * * * *